(12) United States Patent
Katagiri et al.

(10) Patent No.: US 8,686,380 B2
(45) Date of Patent: Apr. 1, 2014

(54) CHARGED PARTICLE BEAM APPARATUS

(75) Inventors: Souichi Katagiri, Kodaira (JP); Takashi Ohshima, Saitama (JP); Sho Takami, Hitachinaka (JP); Makoto Ezumi, Mito (JP); Takashi Doi, Hitachinaka (JP); Yuji Kasai, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 92 days.

(21) Appl. No.: 12/453,986

(22) Filed: May 28, 2009

(65) Prior Publication Data
US 2009/0294697 A1 Dec. 3, 2009

(30) Foreign Application Priority Data

May 28, 2008 (JP) ................................ 2008-139473
Apr. 22, 2009 (JP) ................................ 2009-103490

(51) Int. Cl.
*G21G 5/00* (2006.01)
(52) U.S. Cl.
USPC .................... 250/492.3; 250/492.1; 250/492.2
(58) Field of Classification Search
USPC ........... 250/396 R, 397, 398, 396 ML, 492.1, 250/492.2, 492.3
See application file for complete search history.

(56) References Cited

U.S. PATENT DOCUMENTS

| | | | |
|---|---|---|---|
| 4,833,362 A | 5/1989 | Crewe | |
| 5,898,269 A * | 4/1999 | Baum et al. | 313/542 |
| 7,615,765 B2 * | 11/2009 | Katagiri et al. | 250/492.3 |
| 2006/0231773 A1 | 10/2006 | Katagiri et al. | |
| 2007/0102650 A1 * | 5/2007 | Katagiri et al. | 250/492.3 |

FOREIGN PATENT DOCUMENTS

| | | |
|---|---|---|
| JP | 2002-500809 | 4/1998 |
| JP | 2006-294481 | 4/2005 |
| WO | WO 98/54750 | 4/1998 |

OTHER PUBLICATIONS

L. W. Swanson, "Comparative study of the zirconiated and built-up W thermal-field cathode", J. Vac. Sci. Technol., vol. 12, No. 6, Nov./Dec. 1975, pp. 1228-1233.

* cited by examiner

*Primary Examiner* — Robert Kim
*Assistant Examiner* — Hanway Chang
(74) *Attorney, Agent, or Firm* — Stites & Harbison PLLC; Douglas E. Jackson; Nicholas B. Trenkle

(57) ABSTRACT

The present invention provides a charged particle beam apparatus that keeps the degree of vacuum in the vicinity of the electron source to ultra-high vacuum such as $10^{-8}$ to $10^{-9}$ Pa even in the state where electron beams are emitted using a non-evaporable getter pump and is not affected by dropout foreign particles.

The present invention includes a vacuum vessel in which a charged particle source (electron source, ion source, etc.) is disposed and a non-evaporable getter pump disposed at a position that does not directly face electron beams and includes a structure that makes the non-evaporable getter pump upward with respect to a horizontal direction to drop out foreign particles into a bottom in a groove, so that the foreign particles dropped out from the non-evaporable getter pump do not face an electron optical system. Or, the present invention includes a structure that is covered by a shield means, or a means that is disposed immediately on a surface of the non-evaporable getter pump but at a position where the electron beams are not seen and has a concave structure capable of trapping the dropout foreign particles on a lower portion of the non-evaporable getter pump.

17 Claims, 6 Drawing Sheets

CHARGED PARTICLE BEAM APPARATUS

CLAIM OF PRIORITY

The present application claims priority from Japanese patent applications JP2008-139473 filed on May 28, 2008, and, JP2009-103490 filed on Apr. 22, 2009, the content of which is hereby incorporated by reference into this application.

BACKGROUND OF THE INVENTION

1. Field of the Invention

The present invention relates to a charged particle beam apparatus, such as an electron microscope, an electron beam writer, a focused ion beam system, etc. and in particular, to an evacuating technology that can achieve extremely high degree of vacuum of an electron gun or an ion gun.

2. Description of the Related Art

A scanning electron microscope (SEM) or an electron beam writer (EB) according to the related art accelerates electron beams emitted from an electron gun including a cold cathode field emission type electron source or a thermal field emitter electron source, which are changed into fine electron beams using an electron lens, and scans them as primary electron beams on a sample by using a scanning deflector. In the case of SEM, images are obtained by detecting secondary electrons or reflected electrons and in the case of EB, patterns previously registered on a resist film that is applied on the sample are written. As a material for the field emission type electron source, tungsten has been used in the case of a multi-purpose SEM. Further, in the case of the EB, $LaB_6$ may be used.

The cold cathode field emission type electron gun is a field emission type electron gun that uses a needle-shaped tungsten tip at normal temperature. The electrons are emitted by a tunnel effect that is generated by applying high field to a point of the tip. Brightness is ~108, which is better than that of the thermal field (emission) type. An energy band of the emission electron is narrower than that of the thermal field type (~0.4 eV) and high energy resolution can be obtained. A smaller probe compared with that of the thermal field type can be manufactured, but the total amount of emission current is smaller than that of the thermal field type. Meanwhile, the thermal field type (generally referred to as Schottky electron gun) is an electron gun according to a scheme that heats the needle-shaped tungsten tip under field and emits electrons. The thermal field emitter electron gun heats a tip to ~1800 K and emits electrons using a Schottky effect, wherein the tungsten tip is coated with zirconia and a potential barrier of the tip is lowered (~2.7 eV). The energy band of the emission electron is 0.7 eV, which is slightly wider than that of the cold cathode type, but since the tip is heated all time, stable emission current (variation ratio ~1%) can be obtained without absorbing residual gases on a surface of the tip. Brightness is about 107 to 108.

In order to emit good electron beams from the electron source over a long period of time, there is a need to keep the surrounding area of the electron source at high vacuum ($10^{-8}$ to $10^{-9}$ Pa). To this end, the related art has used a method that forcibly evacuates the surrounding area of the electron gun by an ion pump. Further, there is a charged particle beam apparatus that has a non-evaporable getter pump therein to achieve a higher degree of vacuum (For example, see U.S. Pat. No. 4,833,362 and Japanese Patent Application Laid-Open No. 2006-294481). This is particularly an effective method for the cold cathode field emission type electron source or the thermal field emitter electron source (Schottky electron source).

When a pumping speed is about 20 L/s, generally, the ion pump has a size of 15 cm to 20 cm, which is a pump including a high voltage electrode and a magnet. However, it is difficult to build the ion pump in the vicinity of the electron source. Therefore, the ion pump that is adhered to a side of a barrel (column) configured of the electron gun including the electron source and an electron optical system is usually used.

The non-evaporable getter pump is a pump that chemically absorbs and fixes gas molecules to a special alloy surface and if the surface of the pump is activated by being heated once, it can continue a pumping function without needing any energy. Because the alloy surface is covered with the gas molecules, the pumping speed is reduced, but if the surface of the pump is reactivated by being heated, the gas molecules absorbed on the surface are diffused into the alloy and permanently fixed thereto, such that the non-evaporable pump has a characteristic when a pure surface is exposed, the surface returns to a state capable of absorbing gases again.

Moreover, there is a charged particle beam apparatus including an electron source using a photo-cathode that is different from the field emission type electron source as described in Japanese Unexamined Patent Application Publication No. 2002-500809. If the electron source makes gallium, arsenic, etc., which are special materials, into a thin film and intensively irradiates a laser beam to the rear of the thin film, it also excites an irradiated the thin film to emit electrons. The electron source is suitable for applications for which the time-divided pulse-shaped electron beams are necessary. However, since a size of a light source is large or it is difficult to continuously emit electrons, the electron source is not suitable for observing high resolution which is an object of the present invention. In addition, it can be said that an electron emission mechanism of the photo-cathode uses different physics, and is a totally different technology.

BRIEF SUMMARY OF THE INVENTION

However, the electron source kept in a ultra high degree of vacuum is installed in a narrow region surrounded by the electrode to generate field for extracting and if a small amount of gas is emitted in the vicinity of the electron source, the degree of vacuum inside the electron gun chamber is maintained but the pressure in the vicinity of the electrode of the electron source is suddenly increased, such that an adverse effect may occur. As the gas emission source, in the case of SEM, it is considered that the gas emitted from the observation sample rises from the sample chamber or the electron-stimulated-desorbed gas from the electrode that located in the vicinity of the electron source and is irradiated by electron beams. Such atoms adhered to the surface are excited and emitted again. In particular, in the case of thermal field emitter electron source (Schottky electron source), as described in Journal of Vacuum Science Technology, Vol. 12, No. 6, 1975; L. W. Swanson; "Comparative study of the zirconiated and built-up W thermal-field cathode," it has been known to cause an adverse effect of decreasing the emission current when there is a very small amount of oxygen.

In the case where only the ion pump is used for the vacuum evacuation, since there are an electrode, a magnetic shield, etc. between the electron source and the ion pump and the conductance is lowered, there is a problem in that it is difficult to effectively achieve evacuation in the vicinity of the electron source.

On the other hand, in the case of using the non-evaporable getter pump, there are other problems. The non-evaporable getter pump as described above is an alloy made of zirconium and vanadium system. As described in U.S. Pat. No. 4,833,362, it is preferable to install the alloy while providing a heater for heating somewhere in the vicinity of the electron source. However, in order for the non-evaporable getter alloy to have effective pumping speed like the vacuum pump, the alloy surface area should be practicably widened to have a microscopic concave-convex shape from about 1 µm to about 100 µm so as to be molded. For microscopic concave-convex shape, there is a high probability that the point becomes fragile and drops out. Since the non-evaporable getter alloy has conductive property, if it falls into the electron optical system where there are electrodes applied with a high voltage, it causes problems such as discharge, a short, etc.

Another problem in using the non-evaporable getter pump is that there is a relationship between a temperature (activation temperature) to activate the non-evaporable getter alloy and a baking temperature to heat the vacuum vessel when the vacuum starts. In order to effectively operate the non-evaporable getter pump, there is a need to keep the activation temperature for a predetermined time under pressure of about $10^{-4}$ Pa. By doing so, the gas molecules, which adhere to the non-evaporable getter alloy surface, are diffused into the alloy and the pure surface is exposed, such that the gas molecules can be absorbed again. Since this phenomenon is continued even when the temperature of the non-evaporable getter alloy falls to room temperature, then it is considered that any energy to continue the evacuation is not needed. If the activation temperature selected lower than baking temperature or less in the evacuation procedure, the activation is progressed during the baking and a massive amount of gas generated by the baking is absorbed during the baking, which causes a problem in that the pumping speed decreases or the lifetime of the pump is shortened.

Therefore, it is an object of the present invention to provide a charged particle beam apparatus that keeps the degree of vacuum in the vicinity of the electron source to be ultra-high vacuum such as $10^{-8}$ to $10^{-9}$ Pa even in the state when the electron beams are emitted using the non-evaporable getter pump and are not affected by the dropout foreign particles.

In order to achieve the above object, the present invention includes a vacuum vessel in which a field emission type charged particle source (electron source, ion source, etc.) is disposed and a non-evaporable getter pump disposed at a position that faces the field effect type charged particle source on an electrode surface for extracting as a subsidiary vacuum pump and does not directly face charged particle beams and includes a structure that makes the non-evaporable getter pump upward with respect to a horizontal direction to drop out foreign particles into a bottom in a groove or is covered with a shield means, so that the particles dropped out from the non-evaporable getter pump do not face an electron optical system. Or, the present invention includes a means that the non-evaporable getter pump's position is located where the electron beams are not seen vertically from the surface of the non-evaporable getter pump, and has a concave structure capable of trapping the dropout particles on a lower portion of the non-evaporable getter pump.

Hereinafter, a characteristic configuration example of the present invention will be enumerated.

(1) A charged particle beam apparatus of the present invention includes a charged particle optical system that enters charged particle beams emitted from a field emission type charged particle source on a sample, a vacuum evacuating means that evacuates the charged particle optical system and a non-evaporable getter pump as a subsidiary vacuum pump that evacuates the inside of a vacuum chamber evacuated by the vacuum evacuating means, wherein the non-evaporable getter pump is disposed at a position where an optical axis of the charged particle beam emitted from the field emission type charged particle source does not exist on a portion vertical to the surface of the non-evaporable getter pump.

(2) In the charged particle beam apparatus configured as above, the field emission type charged particle source is disposed so that the charged particle beams are emitted in a gravity direction, the non-evaporable getter pumps are provided in concave parts of grooves formed around an aperture through which the charged particle beams on the electrode surface existing immediately below the field emission type charged particle source, and a heater is provided on a rear of the electrode.

(3) The charged particle beam apparatus configured as above includes the shield means that covers a portion of the non-evaporable getter pump so that the charged particle beams emitted from the field emission type charged particle source are not irradiated to the non-evaporable getter pump.

(4) In the charged particle beam apparatus configured as above, the shape of the electrode is a cup shape and the cylindrical heater is provided on an outer side of the cup-shaped electrode, the non-evaporable getter pumps are provided at outer circumference of the cylindrical heater, and the outer circumference of the non-evaporable getter pump provided in the cylindrical shape is surrounded by a magnetic shield means.

(5) In the charged particle beam apparatus configured as above, the non-evaporable getter pumps are provided at inner circumference of the vacuum vessel including the field emission type charged particle source, the heater is provided between a wall surface of the vacuum vessel and the non-evaporable getter pump at an atmospheric side of the vacuum vessel, and the non-evaporable getter pump is surrounded by the wall surface of the vacuum vessel and the magnetic shield means.

(6) In the charged particle beam apparatus configured as above, the activation temperature of the non-evaporable getter pumps disposed around the electrode is 500° C. and the activation temperature of the non-evaporable getter pump disposed at the inner wall of the vacuum vessel is 350° C.

(7) A vacuum evacuation method according to the present invention includes a process of baking at about 250° C. or less using a heater provided at an atmospheric side while performing rough pumping; a process of baking at about 450° C. or less using a heater provided at an electrode in addition to the condition of the process; a process of activating a non-evaporable getter pump at about 350° C. or more using the heater provided at the atmospheric side; and a process of activating the non-evaporable getter pump at about 500° C. or more using the heater provided at the electrode.

Further, it is to be noted that when an electron gun is called a field emission electron gun, it includes both a cold cathode field emission type electron gun and a thermal field emitter electron gun (generally referred to as Schottky electron gun) and when a charged particle source is called a field emission type charged particle source, it further includes a field emission type ion source. The field emission type ion source is an ion source that can attract gas molecules polarized by field, such as helium, hydrogen, to a point of a needle-shaped metal having a point diameter of 0.1 µm or less cooled at an ultra-cold temperature to attract ion particles, which are ionized electrolytically at the point of the tip, by field and then radiated to be polarized in one direction.

With the present invention, the degree of vacuum in the vicinity of the charged particle source can be kept to the ultra-high vacuum such as $10^{-8}$ to $10^{-9}$ Pa and thus the charged particle beam apparatus without problems due to foreign particles and the vacuum starting method can be provided.

DETAILED DESCRIPTION OF THE INVENTION

Hereinafter, embodiments of the present invention will be described with reference to the accompanying drawings. Further, although the following description describes a charged particle beam generator using a field emission type electron gun as a field emission type charged particle source, it can be applied to a charged particle beam generator using a field emission type ion source as the field emission type charged particle source.

First Embodiment

Figure 1:
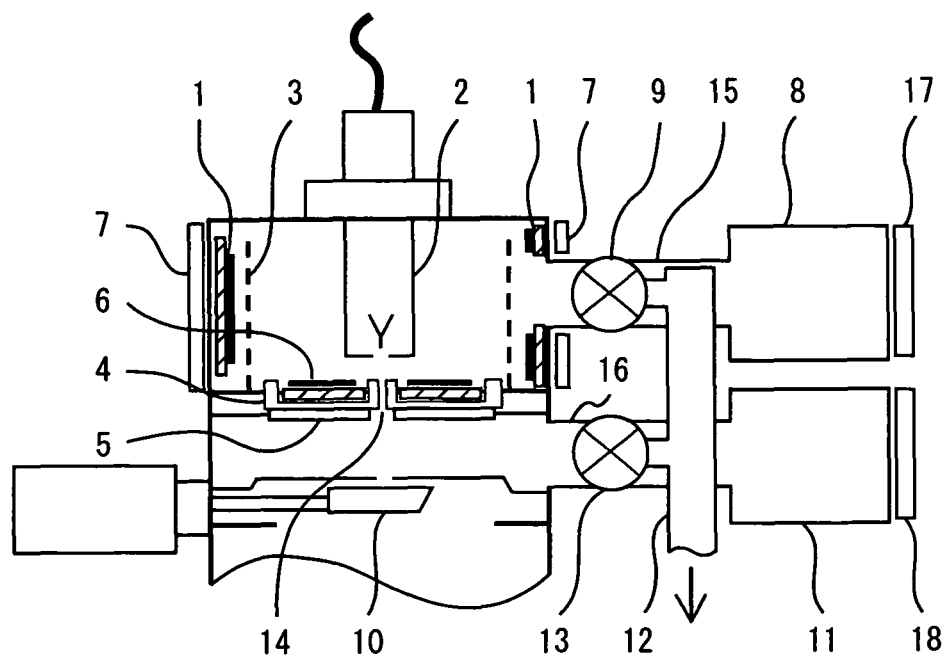
FIG. 1 is a diagram for explaining a configuration of an electron gun that is a charged particle beam generator according to a first embodiment.

FIG. 1 shows a configuration of a charged particle beam generator according to a first embodiment using an electron gun. Hereinafter, the electron gun according to the first embodiment will be described in detail.

A vacuum chamber, which is a vacuum vessel, includes an electron source 2 to emit electrons downward. The emitted electron beam passes through an aperture 14 and enters into a sample via an electron optical system installed below the aperture 14. The inside of the electron gun has a differential pumping system from which the aperture is separated and includes vacuum pumps, respectively, to evacuate each chamber. In the first embodiment, the charged particle beam generator, that is, the electron gun means a configuration that the electron gun is positioned at a higher portion than a movable valve 10.

The vacuum chamber in which the electron source 2 is disposed is coupled with a vacuum pump 8, a valve 9, and a rough pumping port (rough pumping hole) 12 via a vacuum pipe 15. As the vacuum pump 8, for example, an ion pump may be used. A rear of the vacuum pump 8 is provided with a heater 17 for baking. The other vacuum chamber connected to be separated from the vacuum chamber and the aperture 14 is coupled with a vacuum pump 11, a valve 13, and a rough pumping port 12 via a vacuum pipe 16. A rear of the vacuum pump 11 is provided with a heater 18 for baking. The aperture that separates a lower vacuum chamber from the vacuum chamber can be opened and closed by the movable valve 10 and can separate vacuum and atmospheric pressure. Therefore, even when the vacuum is deteriorated due to problems, the valve 10 is closed, thereby making it possible to prevent the increase in pressure inside the electron gun chamber that is the charged particle beam generator.

Next, non-evaporable getter pumps disposed in each chamber will be described in detail. The non-evaporable getter pump is a kind of gas-molecule-absorbable-alloy and is a pump that when it is activated by being heated at a predetermined temperature under vacuum, performs pumping by diffusing gas molecules adhered to the alloy surface into the alloy, forming an active surface on the surface, and absorbing the gas molecules drifted to the circumference. As the alloy, an alloy of zirconium and vanadium system has been used well and marketed. Assume that the temperature necessary for activation is referred to as activation temperature. The activation temperature can be selected depending on a percentage of metal to be included in the alloy. In the first embodiment, a method capable of keeping an efficient pumping speed over a long time by changing the activation temperature according to an installation place is provided. The detailed contents thereof will be described when a vacuum starting method to be described below is described.

Well, although there is a sheet-type non-evaporable getter pump 1 on an inner wall surface of the vacuum chamber in which the electron source 2 is disposed, in the sheet-type non-evaporable getter pump 1, the alloy is deposited only on one side of the sheet. In the sheet-type non-evaporable getter pump 1, the alloy surface becomes a vacuum side of the vacuum chamber and a rear side of the sheet is fixed to contact the inner wall surface. By the above configuration, since it can prevent members from directly contacting the non-evaporable getter alloy surface, reducing the amount of foreign particles dropped out from the non-evaporable getter alloy can be achieved.

The heater 7 for heating is provided at an atmospheric side separated from the wall surface of the vacuum vessel of the non-evaporable getter pump 1. The heater 7 is also used for baking when the evacuation and the activation of the non-evaporable getter pump 1 that is performed later. The method used thereof will be described below in detail.

Figure 2A:
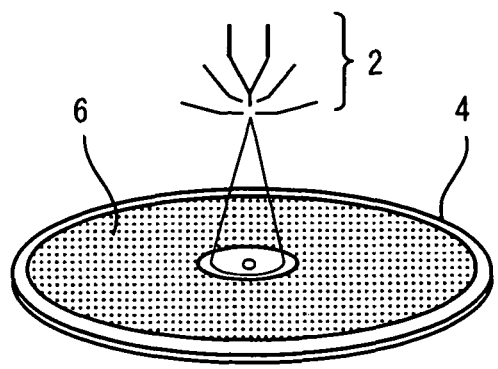
FIGS. 2A and 2B are diagrams for explaining an arrangement configuration of a non-evaporable getter pump according to the first embodiment.
Figure 2B:
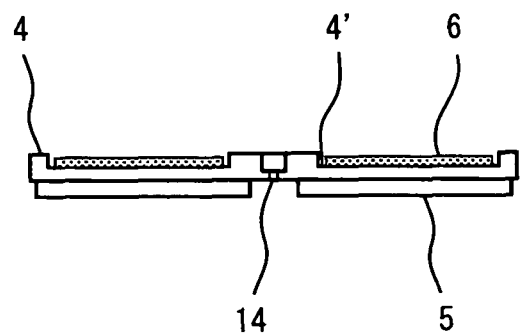

There is an electrode 4 immediately below the electron source 2 and at a position facing the electron source 2. There is the aperture 14 at the center of the electrode 4, wherein electron beams (not shown) emitted from the electron source 2 pass through the aperture 14. An overhead view and a cross-sectional view of the structure of the electrode 4 are shown in FIGS. 2A and 2B, respectively. The shape of the electrode 4 is a disc shape, a surface facing the electron source 2 is formed with a doughnut-shaped groove 4', and the non-evaporable getter pump 6 is fixed in the groove 4' while facing the non-evaporable getter alloy surface up. The non-evaporable getter pump 6 is also a sheet type similar to the above-mentioned non-evaporable getter pump 1. In other words, the optical axis of the electron beam is disposed at a position that does not exist on a portion vertical to the surface of the non-evaporable getter pump 6. More preferably, the non-evaporable getter pump 6 is disposed at a position where the electron beams emitted from the electron source 2 are not irradiated. The rear of the electrode 4 is provided with a heater 5 for heating, which can heat the electrode 4 and the non-evaporable getter pump 6. Further, for convenience of explanation, it is to be noted that there is a case where the non-evaporable getter pump 6 and the non-evaporable getter pump 1 is referred to as the first and second non-evaporable getter pumps, respectively.

Next, a method of evacuating the electron gun, which is the charged particle beam generator, to ultra-high vacuum from the atmosphere will be described. First, the valves 9 and 13 for rough pumping are opened and the vacuum evacuation starts by the vacuum evacuating means (not shown) that exists at a lower side of the rough pumping port 12. The time is estimated in order to make the internal degree of vacuum become about $10^{-4}$ Pa and the following baking process is performed. The degree of vacuum is a level that can be sufficiently achieved in about one hour from the rough pumping starting in a general electron gun. In the following baking process, in addition to the vacuum evacuation of the previous process, each heater 7, 17, and 18 is conducted to heat the whole vacuum vessel to about 150 to 200° C. The process is performed to suppress gas emission from the vacuum inner wall surface. The longer the time, the more the gas emission decreases, but in actuality, the gas is sufficiently emitted in about 10 hours.

The baking of the electrode 4 is performed following the baking process. The electrode 4 is a part that is irradiated by the electron beams emitted from the electron source 2 and since the gas emission is excited by the incidence of electrons, there is a need to reduce the gas molecules before the other portions. Then, gas absorbed on the surface, hydrogen existing in the inside of the electrode, etc. are emitted by heating the electrode 4 to about 400° C. The gas emitted from each heater is evacuated through the rough pumping port 12, but if the wall surface temperature of the circumference is low, an effect of re-adhesion decreases. Then, the re-adhesion of the gas molecule is avoided by further heating the electrode 4 to a state heated by the previous process. Even with this process, about 10 hours are standard. At this time, the vacuum pump 8 and the other vacuum pump 11 are operated.

Next, in addition to the baking of the electrode 4, the activation of the non-evaporable getter pump is performed. In the step of the process, the non-evaporable getter pump 1 is heated to 150 to 200° C. and the other non-evaporable getter pump 6 is heated to about 400° C. Herein, the activation temperature of the non-evaporable getter pump 1 is 350° C. and the activation temperature of the other non-evaporable getter pump 6 is 500° C. As such, it is important to make the activation temperature higher than the baking temperature throughout all the processes. By doing so, the activation can be prevented during the baking. Since massive amounts of gas generated during the baking is not absorbed, the non-evaporable getter pump can be used without reducing the pumping speed or lifetime thereof. In the first embodiment, the activation temperature of the non-evaporable getter pump 1 is 350° C. and the activation temperature of the other non-evaporable getter pump 6 is 500° C.

In the present process, it is preferable that the voltage conducting the heater 7 at the atmospheric side and the heater 5 at the rear of the electrode 4 rises to set the activation temperature so as to exceed the baking temperature. In the first embodiment, the activation temperature of the non-evaporable getter pump 1 rises to 400° C. and the activation temperature of the other non-evaporable getter pump 6 rises to 600° C., such that they are activated. This activation is performed by keeping the activation temperature to about one hour. Further, when the non-evaporable pump is activated, a large amount of gas and hydrogen are generated and emitted according to heating. If overload is applied to the vacuum pumps 8 and 11 by the gas generation, it is preferable to turn-off the vacuum pump during the activation process.

When the activation of the non-evaporable getter pump ends, as the following process, conduction to each heater stops and the heaters are cooled down to room temperature. If the vacuum pump 8 is turned-off in the previous process, it is preferable to wait for the increase of the degree of vacuum by turning-on the vacuum pump and closing the valves 9 and 13 of the rough pumping port.

By the above process, the degree of vacuum in the vicinity of the electron source 2 inside the electron gun can be achieved to a level higher than $10^{-9}$ Pa.

Thus, in the electron gun achieving the ultra-high vacuum, if the electron beams are emitted from the electron source 2, the emitted electron beam faces the electrode 4 while diffusing into a cone shape as shown in FIGS. 2A and 2B. Generally, as a well-known phenomenon, the excited gas molecules are emitted from the surface to which the electron beams are irradiated. In the electron gun, it is not preferable that a new gas emission source is generated in the vicinity of the electron source necessary for the ultra-high vacuum. In the configuration of the related art, since the vacuum pump 8 or the non-evaporable getter pump 1 are disposed at a position separated from the electron source 2, there is a problem in that the influence by the gas due to the irradiation of the electron beams or the gas entered from the lower side of the electron gun is not prevented. However, in the first embodiment, a large effect capable of performing effective evacuation can be obtained by providing the non-evaporable getter pump 6 at a position facing the electron source 2 in the vicinity of the electron source 2. In addition, the groove 4' is formed in the electrode 4 and the non-evaporable getter pump is disposed in the groove 4' upward, such that an adverse effect due to the dispersion of foreign particles generated by dropping out chipped pieces of the non-evaporable getter alloy can be also prevented.

Other effects according to the first embodiment will be described. As shown in FIGS. 2A and 2B, the first non-evaporable getter pump 6 provided on the electrode 4 is disposed at a position where the electron beams are not irradiated. This is to avoid gas emission by the irradiation of the electron beam as described above. The surface of the non-evaporable getter pump 6 has a microscopic concave-convex shape to increase the pumping speed and since the surface area is widened, if the electron beams are irradiated, there is a high possibility that a large amount of gas can be emitted, which is particularly important.

Figure 3A:
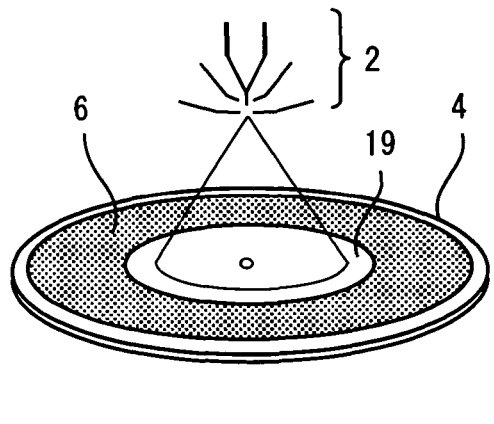
FIGS. 3A and 3B are diagrams for explaining a modified arrangement configuration of the non-evaporable getter pump according to the first embodiment.
Figure 3B:
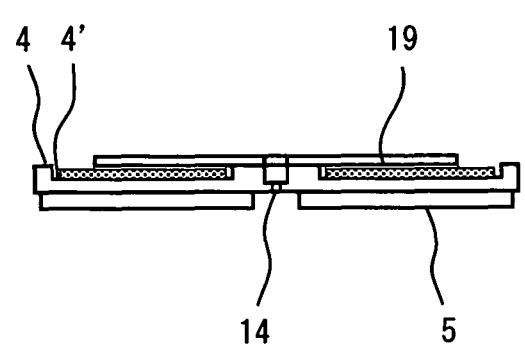

Herein, there is a case where the non-evaporable getter pump 6 is installed in order to increase the limitation of the used electron source or electron optical system to the irradiation region of the electron beams. At this time, as a modified example of the first embodiment, an overhead view and a cross-sectional view of a configuration as shown in FIGS. 3A and 3B are effective. There is a structure where a shield plate 19 is provided on the irradiation portion of the electron beams of the upper portion of the electrode 4. By the above-mentioned structure, the non-evaporable getter pump 6 can be effectively provided while suppressing the lowering of gas emission due to the irradiation of the electron beams.

Figure 4:
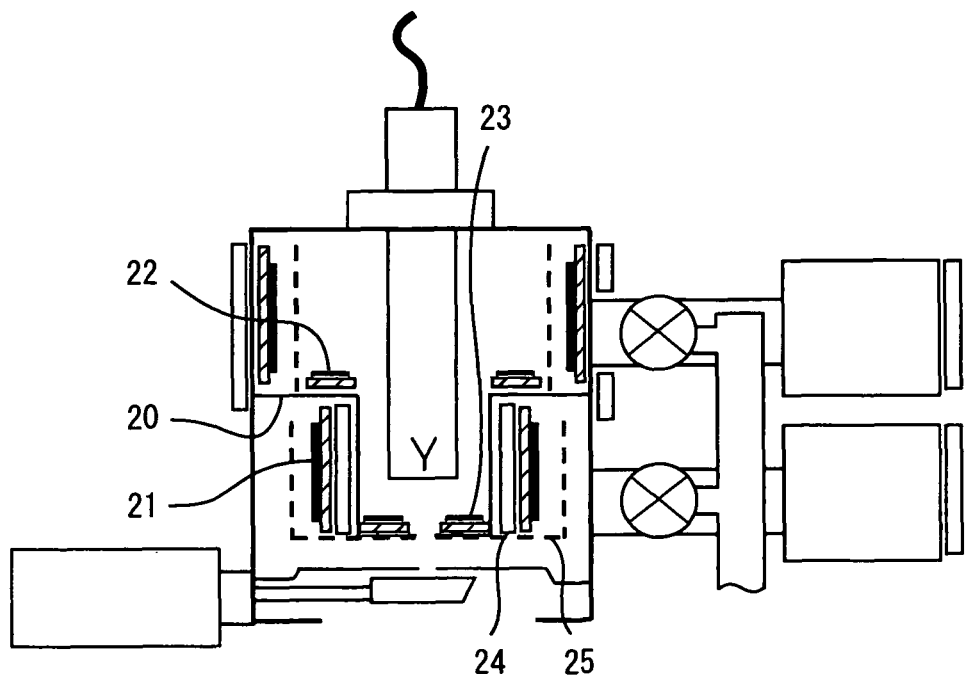
FIG. 4 is a diagram for explaining a modified configuration of the electron gun according to the first embodiment.
Figure 5:
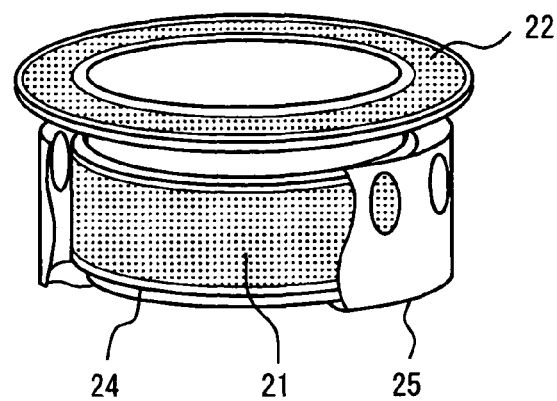
FIG. 5 is a diagram for explaining a configuration of an electrode using the configuration of the electron gun of FIG. 4.

Next, the structure of another modified example, which changes the configuration of the electron gun, will be described with reference to FIG. 4. In the modified example, there is a case where the shape of the electrode 4 according to the previous embodiment is an electrode 20 changed from the disc shape to the cup shape. By this structure, since the wall surface in the vicinity of the electron source 2 can be baked at a high temperature by the internal heater, it is effective in reducing the degassing amount. Since another structure of the cup-shaped electrode 20 is similar to the previous embodiment, the cup-shape electrode 20 will be described herein. There is a cylindrical heater 24 on the side of the cup-shaped electrode 20, such that the electrode 20 can be heated. The non-evaporable getter pump 21 is wound around the cylindrical heater 24, such that it can be also heated by the heater 24. FIG. 5 is a perspective view of the cup-shaped electrode 20. The non-evaporable getter pumps 22 and 23 disposed upward are disposed in the middle of the groove similar to the non-evaporable getter pump 6 shown in FIG. 1 of the previous embodiment, making it possible to prevent the dispersion of foreign particles. Moreover, the non-evaporable getter pump 21 wound around the cylindrical heater 24 is covered with the magnetic shield 25 and has a structure where even if the foreign particles occur, the foreign particles are supplemented with the magnetic shield cover and the dropout dispersion does not occur in the region through which the electron beams pass. As can be clearly appreciated from FIG. 5, holes are disposed on the side of the magnetic shield 25 so that the pumping conductance of the non-evaporable getter pump 21 becomes large. Also, for convenience of explanation, there is a case where the non-evaporable getter pump 21 is referred to as a third non-evaporable getter pump.

The vacuum evacuating method of the electron gun having the present structure is basically similar to the disc-shaped electrode 4 according to the previous embodiment. The difference is the activation temperature of the non-evaporable getter pumps 21, 22, and 23 provided around the cup-shaped electrode 20. In the electron gun, the activation temperature of the non-evaporable getter pump 21 is 500° C. and the non-evaporable getter pumps 22 and 23 are 400° C. Herein, at the baking sequence, the temperature of the non-evaporable getter pump 21 is 400° C., and that of the non-evaporable getter pumps 22 and 23 is 300° C.

Second Embodiment

Figure 6:
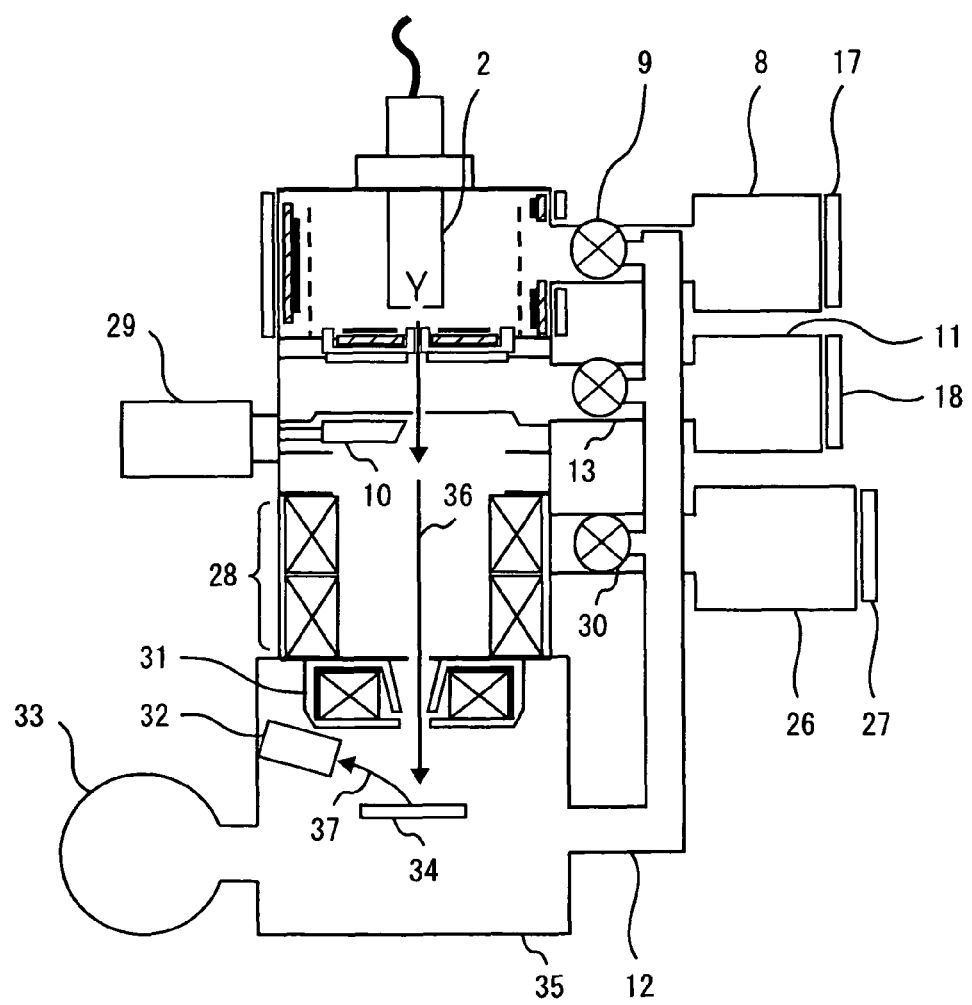
FIG. 6 is a diagram for explaining one configuration example of a scanning electron microscope according to a second embodiment.

In a second embodiment, a case where the electron gun described in the first embodiment is applied to the scanning electron microscope will be described. FIG. 6 is a schematic configuration diagram of the scanning electron microscope (SEM). The electron gun as the charged particle beam generator shown in FIG. 1 is mounted on the top. An electron optical system 28, an objective lens 31, and a sample chamber 35 are disposed on the lower portion of the electron gun in series and are separated each other by the aperture for passing through the electron beam 36. The vacuum evacuation of the electron optical system chamber 28 includes a dedicated vacuum pump 26 similar to the electron gun. For the vacuum evacuation from the atmosphere, each chamber is connected to the rough pumping port 12 and can be opened and closed by the valve 30 for rough pumping. The rough pumping port 12 is connected to the sample chamber 35 and the vacuum evacuation of the sample chamber 35 is performed by a turbo molecular pump 33.

Next, the vacuum starting method according to the second embodiment will be described. In the case of the vacuum evacuating from the atmosphere, the turbo molecular pump 33 as the vacuum evacuating means connected to the sample chamber 35 is driven to perform the rough pumping of the entire apparatus. At this time, all the valves 9, 13, and 30 for rough pumping are opened. If the entire degree of vacuum achieves to the order of $10^{-5}$ Pa, the baking of the apparatus is ready to operate. The preset temperature is controlled in a range of 150 to 200° C. The baking time may be about 8 to 10 hours. From the above description, it may be considered that the previous processes are basically similar to the processes described in the first embodiment. The difference is the closing time of the valve 30 for rough pumping at the lower side than the electron gun. It is preferable to close the valve 30 for rough pumping before the baking ends and also before the activation of the non-evaporable getter pump.

By operating as described above, the ultra-high vacuum can be obtained with each of the individually provided ion pumps without being affected by a large amount of gas emission generated at the time of activation.

In the case of observing the SEM image, the movable valve 10, which passes through the electron beam 36 emitted from the electron source 2, is driven by a valve driving means 29 to open the aperture. The electron beam which passes through the aperture is intensively focused and scanned on the observation plane of the sample 34 by the electron optical system 28 and the objective lens 31, thereby generating secondary electrons 37. The secondary electrons are detected by a detector 32 and formed as image signals by a controller (not shown). It is preferable that the image signals are displayed on an image display means (not shown).

With the second embodiment, the degree of vacuum in the vicinity of the electron source 2 is kept to the ultra-high vacuum, such that the stable image can be obtained without changing the current of the electron beams used for the SEM image observation.

Third Embodiment

A configuration of a third embodiment where the charged particle beam generator having a separate configuration is applied to the scanning electron microscope apparatus will be described with reference to FIG. 7.

An electron gun according to the third embodiment has a structure including a non-evaporable getter pump 36 having a high pumping speed in addition to the vacuum pump 11 that evacuates the vacuum chamber 39 that is located lower side of the vacuum chamber 38 in which the electron source 2 exists. Theses two chambers are separated each other by the aperture.

Figure 7:
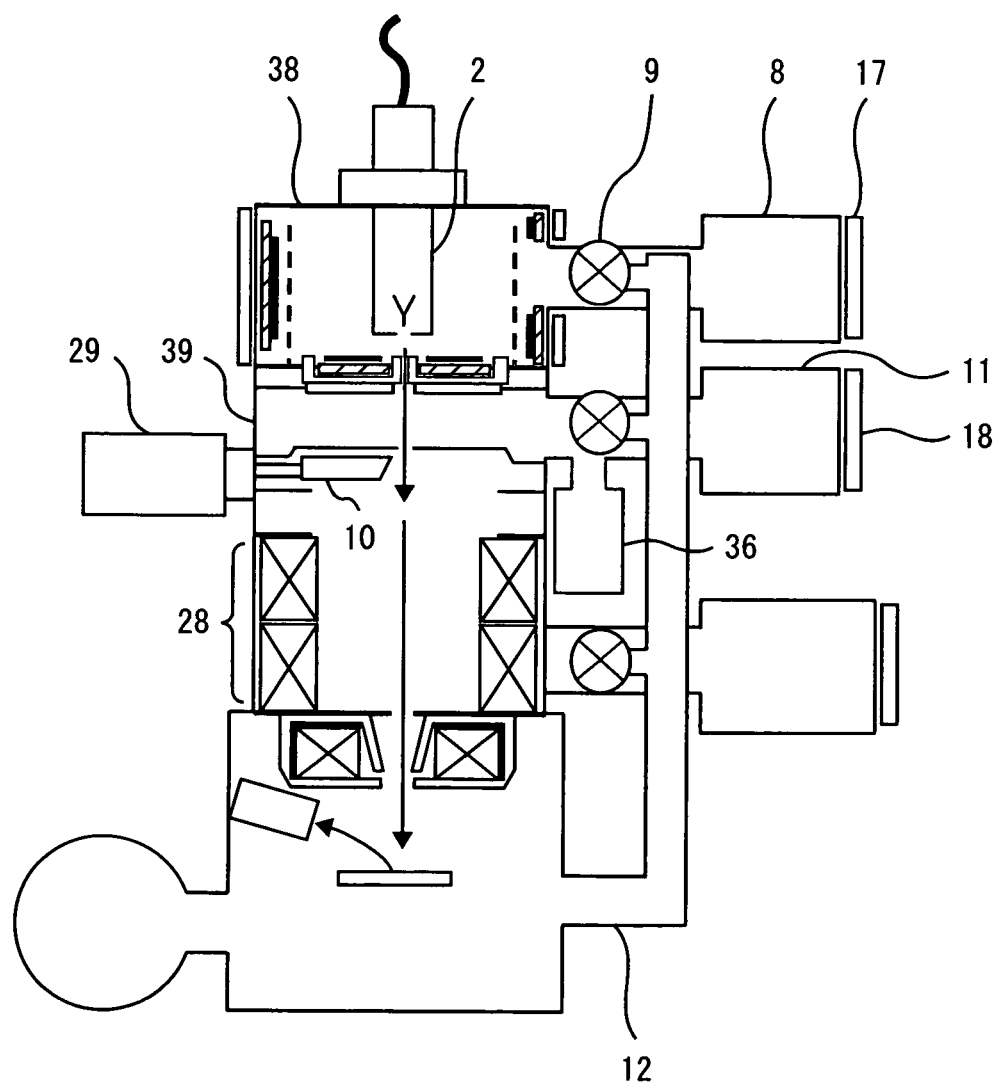
FIG. 7 is a diagram for explaining one configuration example of another scanning electron microscope according to a third embodiment.

In the scanning electron microscope, in the case of observing the images as shown in FIG. 7, since the scanning electron microscope is connected to the sample chamber having the lowest degree of vacuum by the aperture through which the electron beams passes, there is a problem. The problem is an increased possibility that the gas in the sample chamber could blow up in the vicinity of the electron source 2. For this problem, there is an effective solution by introducing the vacuum pump that has higher pumping speed at the lower side than the chamber in which the electron source is set.

Figure 8:
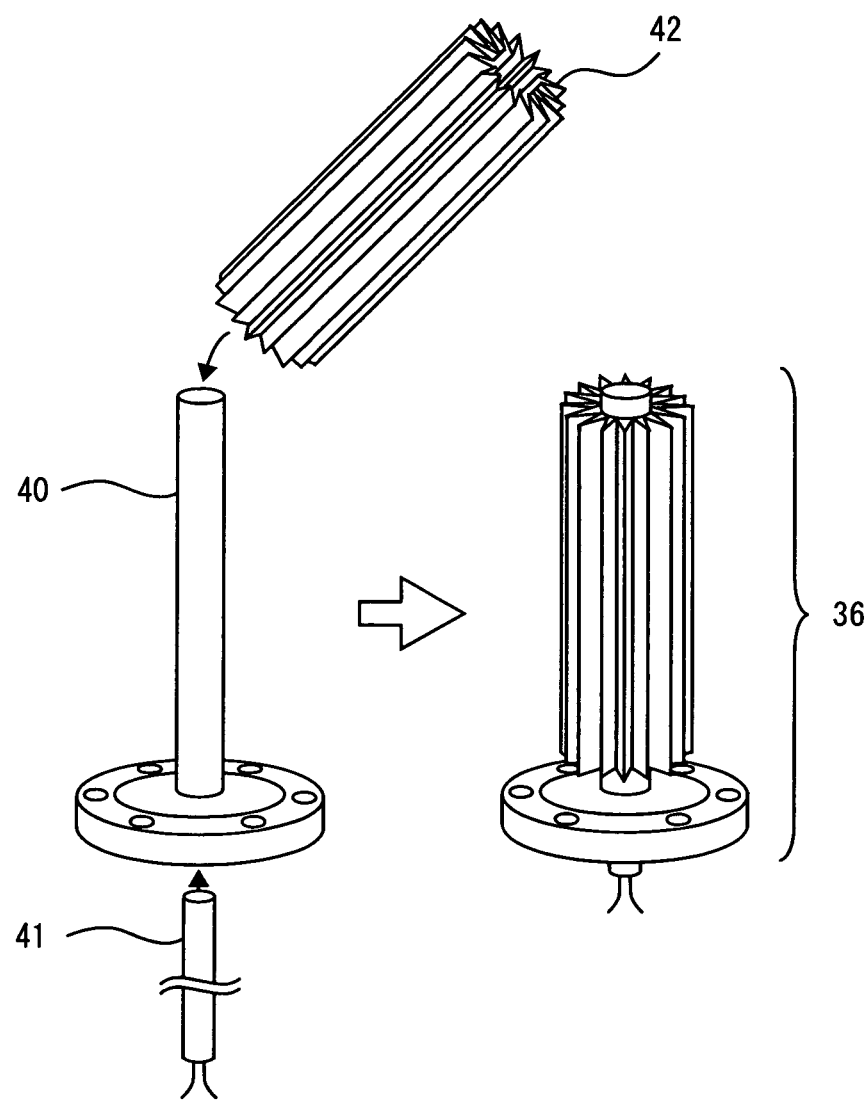
FIG. 8 is a diagram for explaining a configuration example of a cassette-shaped non-evaporable getter pump used in the third embodiment.

For the non-evaporable getter pump 36 having the high pumping speed of FIG. 7, a cartridge-type non-evaporable getter pump shown in FIG. 8 is effective. In other words, the cartridge-type non-evaporable getter pump is a cartridge-type non-evaporable getter pump 36 that is formed by welding a pipe to a vacuum flange and winding and fixing the sheet-type non-evaporable getter pump 42 tied in an accordion-fold shape around a pipe being a part 40 into which the heater 41 can be inserted from the atmospheric side. The cartridge-type non-evaporable getter pump 36 is used installing the port of the vacuum chamber 39 of FIG. 7. Further, for convenience's sake, it is to be noted that there is a case where the non-evaporable getter pump 36 is referred to as a fourth non-evaporable getter pump.

The vacuum evacuating method is approximately equal to the second embodiment. After baking, when the non-evaporable getter pump is activated, it is preferable to heat and activate the non-evaporable getter pump 42 inside the vacuum by switching on the heater 41 of the cartridge-type non-evaporable getter pump 36. Other processes may be the same as the method shown in the second embodiment.

As described above, although the preferred embodiments of the present invention describes the scanning electron microscope (SEM) using the electron source, it is clear that the present invention used the ion source instead of the electron source, for example, can be similarly applied to a focused ion beam (FIB) system. In this case, as the field emission type charged particle source, the field emission type ion source can be used.

Fourth Embodiment

Next, a fourth embodiment to be described below relates to one configuration example of a case where the scanning electron microscope to which the cold cathode field emission electron gun is applied.

The cold cathode field emission type electron gun is a field emission type electron gun that uses a needle-shaped tip made of tungsten at a room temperature. The electrons are emitted by a tunnel effect generated by applying high field to a point of the tip. Brightness is high, which is better than that of the thermal field (emission) type. The energy bandwidth of the emission electron is narrower (~0.4 eV) than that of the thermal field type and high energy resolution can be obtained, such that the scanning electron microscope having the cold cathode field emission type electron gun is frequently used as a multi-purpose microscope necessary for high resolution observation.

In order for the cold cathode field emission type electron gun to emit electrons well, there is a need to remove materials such as extra gas molecules, etc. that covers the surface of the tungsten tip before the emission. To this end, an operation called flashing is performed. The flashing heats the tungsten tip, which is fixed to a filament, by flowing current into the tungsten tip for a short time to remove the extra materials adhered to the surface of the tungsten tip. Therefore, there is a need to keep the gas molecules to be extremely small in the vicinity of the tungsten tip.

In the fourth embodiment, an apparatus configuration and a method of operating the same when the non-evaporable getter pump is disposed in the vicinity of the tungsten tip will be described. In the above configuration, it is important to do not suppress the generation of the field emission electrons caused by the adhesion of gas molecules to the surface of the tungsten tip at the time of heating when the non-evaporating getter pump is activated, and also important to evacuate the gas molecules generated from the surface of the tungsten tip at the time of the flashing by using the non-evaporable getter pump.

Figure 9:
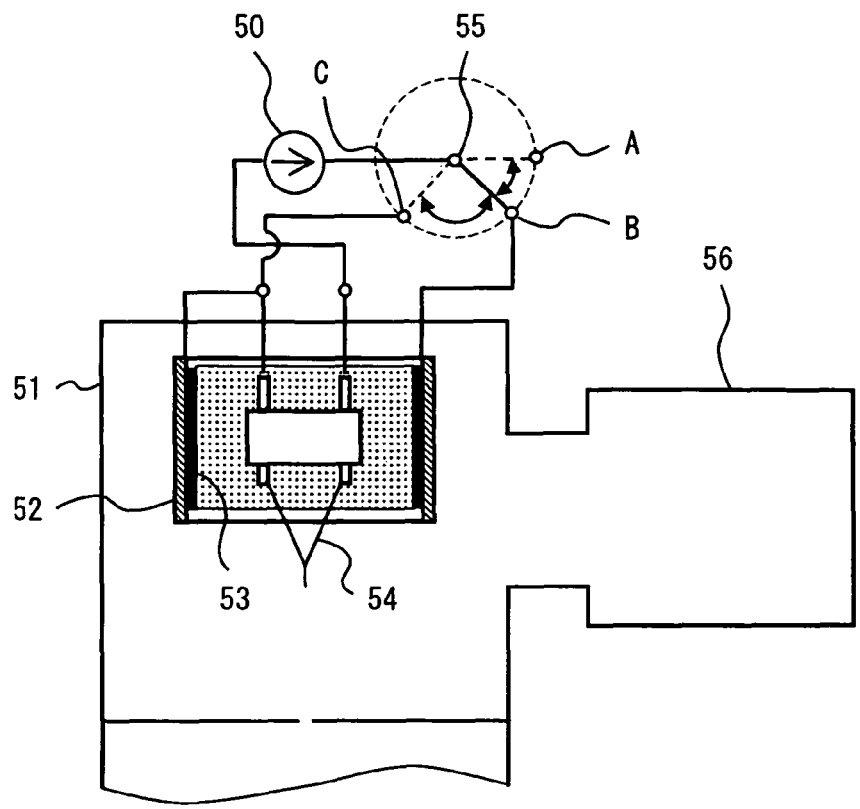
FIG. 9 is a diagram for explaining a configuration example of the non-evaporable getter pump used in a fourth embodiment.

Next, the contents of the fourth embodiment will be described in detail with reference to the accompanying drawings. FIG. 9 schematically shows the whole configuration of the field emission type electron gun according to the fourth embodiment. A column 51 in which an electron source 54 is disposed includes an ion pump 56. Further, a non-evaporable getter pump 53 sintered by a metal sheet is disposed around the electrode source 54 along an inner wall surface of a cylindrical ceramic heater 52 and is disposed to surround the circumference of the electron source 54.

Next, the vacuum evacuating around the electron gun according to the fourth embodiment will be described. The evacuation from the atmosphere is made to high vacuum of about $10^{-5}$ Pa by using a turbo molecular pump (not shown) from a rough pumping port (not shown). Thereafter, the heater (not shown) is conducted to heat the electron gun column 51 and keeps it to 200 to 250° C. for 10 hours so as to perform baking. In the end of the baking, the non-evaporable getter pump 53 is activated by using a constant current generator 50 in a state where the electron gun column 51 is still high temperature. By doing so, the re-adhesion of a large amount of gas generated at the time of the activation to the inner wall surface of the electron gun column 51 can be prevented and the achieved degree of vacuum when the temperature falls to a room temperature becomes high. Further, the activation time of the non-evaporable getter pump, which depends on its specification, is 10 minutes at 800° C. in the fourth embodiment.

In the fourth embodiment, when being conducted to the non-evaporable getter pump 53 and heating it, the electron source 54 is conducted and heated at the same time, such that a large amount of gas generated from the non-evaporable getter pump 53 is not re-adhered to the surface of the electron source 54. As described above, the field emission type electron gun cannot obtain excellent emission current if the pure surface of tungsten is not exposed. Consequently, as described in the fourth embodiment, if the non-evaporable getter pump is disposed in the vicinity of the electron source 54, the surface of the tungsten tip is contaminated due to degassing from the non-evaporable getter pump such that there is a disadvantage in that excellent emission current cannot be obtained, but if the fourth embodiment is applied, there is no contamination and the activation one can keep the high degree of vacuum around the electron source.

Next, the conducting and heating circuit according to the fourth embodiment will be described. One of the output terminals of the constant current generator 50 shown in FIG. 9 is connected to a switch 55, which can switch over three terminals (A, B, and C). When the switch 55 is connected to terminal A, the heating circuit is switched off. If the switch 55 is connected to terminal B, a current flows in the ceramic heater 52 holding the non-evaporable getter pump 53, thereby heating the non-evaporable getter pump 53. Thereafter, current is conducted from the terminal of the electron source 54 and the electron source 54 is also heated at the same time. At last, the current output from the constant current generator 50 returns to the constant current generator 50 from the other terminal of the electron source 54, such that a series circuit is formed. Finally, if the switch 55 is connected to terminal C, a current is conducted only to the electron source 54, making it possible to perform the flashing of the electron source.

Figure 10:
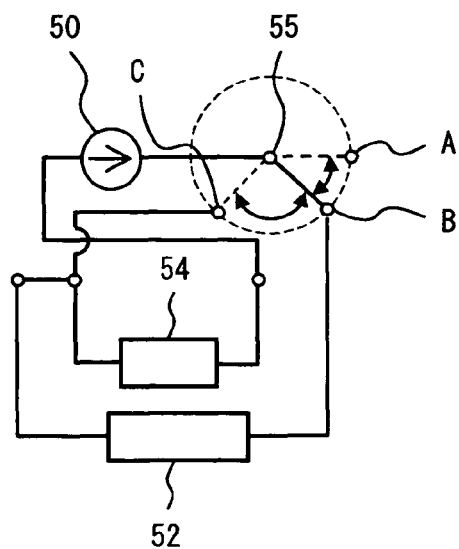
FIG. 10 is a diagram for explaining an equivalent structure of the non-evaporable getter pump and a circuit for heating of the electron source used in the fourth embodiment.

FIG. 10 shows an equivalent circuit of the conducting and heating circuit. A resistance of the ceramic heater 52 and a resistance of the electron source 54 are shown as a square. Three, that is, A: non-conduct, B: conduct the non-evaporable getter pump 53 and the electron source 54 in series, C: conduct only to the electron source, can be selected by switching over the switch. The current supplied by the constant current generator 50 is an unambiguously determined value together with the temperature heating the electron source 54. In the fourth embodiment, the current is used in the range of 2 to 8 A by the heating temperature. The ceramic heater 52 is assumed to have a resistance specification of about 30Ω at a room temperature. When activating the non-evaporable getter pump 53, the switch 55 is assumed to be terminal B and conducts 2.5 A. The current is one corresponding to heating the non-evaporable getter pump to a temperature of 800° C. and the electron source 54 to a temperature of 1500° C.

It is confirmed that the achieved vacuum pressure in the vicinity of the electron source 54 obtains ultra-high vacuum pressure of $10^{-9}$ Pa or less by performing the vacuum evacuating method of the electron gun as described above.

In the fourth embodiment, the non-evaporable getter pump 53 is disposed to surround the electron source 54, but the configuration thereof is not limited thereto. For example, as in the configuration of the first embodiment shown in FIG. 1, the non-evaporable getter pump 6 may be disposed so that the electron source 2 is disposed thereon. At this time, the conducting and heating circuit may be equivalent to one shown in FIG. 10 and can be configured without specially change. In addition to this, although some arrangement and configuration may be considered, if the electron source is configured to be able to be heated when the non-evaporable getter pump is activated, it is apparent that the same effect can be obtained.

The foregoing present invention is useful as the evacuating technology to achieve extremely high degree of vacuum of the charged particle beam apparatus, such as the electron microscope, the electron beam writer, the focused ion beam system, etc. and in particular, the electron gun or the ion gun.

What is claimed is:

1. A charged particle beam apparatus, comprising:
   a charged particle beam generator having a charged particle source;
   a charged particle optical system that enters charged particle beams emitted from the charged particle source on a sample;
   a vacuum evacuating means that evacuates the charged particle beam generator and the charged particle optical system; and
   a subsidiary vacuum pump that evacuates the charged particle beam generator, and
   wherein the charged particle source is configured of a field emission type charged particle source and the subsidiary vacuum pump is configured of a first non-evaporable getter pump comprising an alloy surface that extends orthogonally to a direction in which the charged particle beams are emitted from the field emission type charged particle source,
   wherein, the field emission type charged particle source is disposed to emit the charged particle beams in a gravity direction,
   wherein an electrode having an aperture through which the charged particle beams passes is provided immediately below the field emission type charged particle source,
   wherein the first non-evaporable getter pump is disposed around the aperture on the electrode surface, and
   wherein the electrode has a groove formed on a surface thereof, and the first non-evaporable getter pump is formed on a bottom of the groove.

2. The charged particle beam apparatus according to claim 1, further comprising a heater provided on the rear of the electrode.

3. The charged particle beam apparatus according to claim 1, wherein the electrode has a groove formed on the electrode surface, and the first non-evaporable getter pump is formed in a sheet shape and set on the bottom of the groove.

4. The charged particle beam apparatus according to claim 3, wherein a portion to which the charged particle beams of the first non-evaporable getter pump is irradiated is provided with a shield plate.

5. The charged particle beam apparatus according to claim 1, wherein the charged particle beam generator includes a magnetic shield, a heater provided around an outer wall at an atmospheric side, and a second non-evaporable getter pump that is disposed in a region surrounded by the magnetic shield along an inner wall.

6. The charged particle beam apparatus according to claim 1, wherein the electrode has a cup shape and the cup-shaped electrode includes a cylindrical heater on a side thereof, and a third non-evaporable getter pump disposed along a side of the cylindrical heater, the circumference of the third non-evaporable getter pump being surrounded by a magnetic shield.

7. The charged particle beam apparatus according to claim 6, wherein the side of the magnetic shield is provided with the apertures.

8. The charged particle beam apparatus according to claim 1, wherein the charged particle beam generator includes a region where the field emission type charged particle source is disposed and a vacuum chamber, the charged particle beam generator being connected to the vacuum chamber via the aperture of the electrode and the vacuum chamber being provided with a main vacuum evacuating means and a sub vacuum evacuating means.

9. The charged particle beam apparatus according to claim 8, wherein an ion pump is used as the main vacuum evacuating means and a fourth non-evaporable getter pump is used as the sub vacuum evacuating means.

10. The charged particle beam apparatus according to claim 1, wherein a heating temperature when the first non-evaporable getter pump is activated is set to be higher than a baking temperature that promotes degassing by heating the apparatus when vacuum evacuates.

11. The charged particle beam apparatus according to claim 1, wherein a portion to which the charged particle beams of the first non-evaporable getter pump is irradiated is provided with a shield plate.

12. A charged particle beam apparatus, comprising:
   a charged particle beam generator having a charged particle source;
   a charged particle optical system that enters charged particle beams emitted from the charged particle source on a sample;
   a vacuum evacuating means that evacuates the charged particle beam generator and the charged particle optical system; and
   a subsidiary vacuum pump that evacuates the inside of charged particle beam generator evacuated by the vacuum evacuating means, wherein
   the charged particle source is a field emission type charged particle source,
   the subsidiary vacuum pump is configured of a first non-evaporable getter pump comprising an alloy surface that extends orthogonally to a direction in which the charged particle beams are emitted from the field emission type charged particle source, and
   the charged particle beam generator includes a magnetic shield, a second non-evaporable getter pump that is disposed in a region surrounded by the magnetic shield along an inner wall of the charged particle beam generator, and a heater that heats the second non-evaporable getter pump around an outer wall at an atmospheric side,
   the field emission type charged particle source is disposed to emit the charged particle beams in a gravity direction,
   an electrode having an first aperture through which the charged particle beams passes is provided immediately below the field emission type charged particle source,
   the first non-evaporable getter pump is disposed around the first aperture on the electrode surface, and the electrode has a groove formed on a surface thereof, and the first non-evaporable getter pump is formed on a bottom of the groove.

13. The charged particle beam apparatus according to claim 12, further comprising:
a cup-shaped electrode provided immediately below the field emission type charged particle source, the cup-shaped electrode having a second aperture through which the charged particle beams passes,
wherein the cup-shaped electrode includes a cylindrical heater on a side thereof, and a third non-evaporable getter pump disposed along a side of the cylindrical heater, and a magnetic shield surrounding the circumference of the third non-evaporable getter pump along the side of the heater.

14. The charged particle beam apparatus according to claim 13, wherein the side of the magnetic shield is provided with the apertures.

15. The charged particle beam apparatus according to claim 12, wherein the charged particle beam generator includes a vacuum chamber connected to the charged particle beam generator via the first aperture through which the charged particle beams passes, the vacuum chamber being provided with a main vacuum evacuating means and a sub vacuum evacuating means.

16. The charged particle beam apparatus according to claim 15, wherein an ion pump is used as the main vacuum evacuating means, and a fourth non-evaporable getter pump is used as the sub vacuum evacuating means.

17. The charged particle beam apparatus according to claim 12, wherein a heating temperature when the second non-evaporable getter pump is activated is set to be higher than a baking temperature that promotes degassing by heating the apparatus when vacuum starts.

* * * * *